United States Patent
Berntsen et al.

(10) Patent No.: US 7,390,578 B2
(45) Date of Patent: *Jun. 24, 2008

(54) ARYL-SUBSTITUTED POLY-P-ARYLENEVINYLENES

(75) Inventors: Adrianus Johannes Mattheus Berntsen, Manchester (GB); Hermannus Franciscus Maria Schoo, Eindhoven (NL); Henricus Franciscus Johannus Jacobus Van Tongeren, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 10/780,472

(22) Filed: Feb. 17, 2004

(65) Prior Publication Data
US 2004/0161634 A1 Aug. 19, 2004

Related U.S. Application Data

(63) Continuation of application No. 09/790,201, filed on Feb. 21, 2001, now Pat. No. 6,743,525.

(30) Foreign Application Priority Data
Feb. 23, 2000 (EP) .................. 00200605

(51) Int. Cl.
*H01L 51/54* (2006.01)
*C08G 61/02* (2006.01)
*C09K 11/06* (2006.01)

(52) U.S. Cl. ............ 428/690; 428/917; 313/504; 257/40; 257/E51.031; 528/86; 528/397

(58) Field of Classification Search .......... 428/690, 428/917; 313/504, 506; 257/40; 526/293, 526/294, 296; 528/86, 397
See application file for complete search history.

(56) References Cited

U.S. PATENT DOCUMENTS

| | | | |
|---|---|---|---|
| 6,638,646 B2 * | 10/2003 | Spreitzer et al. | 428/690 |
| 6,743,525 B2 * | 6/2004 | Berntsen et al. | 428/690 |
| 7,041,388 B1 * | 5/2006 | Spreitzer et al. | 428/690 |
| 2002/0064680 A1 * | 5/2002 | Spreitzer et al. | 428/690 |

FOREIGN PATENT DOCUMENTS

| | | | |
|---|---|---|---|
| WO | 9827136 | | 6/1998 |
| WO | WO 98/27136 A1 | * | 6/1998 |
| WO | 9921936 | | 5/1999 |
| WO | WO 99/21936 A1 | * | 5/1999 |
| WO | WO 99/24526 A1 | * | 5/1999 |
| WO | WO-99/24526 A1 | * | 5/1999 |

* cited by examiner

*Primary Examiner*—Marie R. Yamnitzky
(74) *Attorney, Agent, or Firm*—Paul Im

(57) ABSTRACT

Aryl-substituted poly-p-arylenevinylenes comprising a repeating unit of the formula (C1),

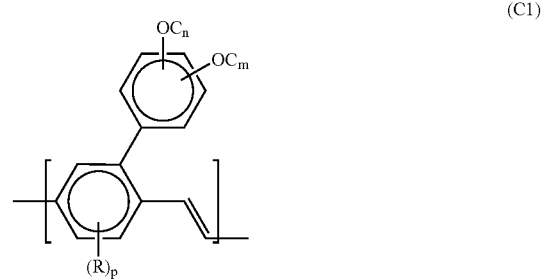

(C1)

in which one or more of the unsubstituted aromatic carbon atoms may be replaced by nitrogen atoms, $-OC_m$ and $-OC_n$ are alkoxy groups, m and n are integers from 2 to 6 with m+n=8, p is 0, 1, 2 or 3 and in which R is CN, Cl, F, $CF_3$, $NO_2$, or $SO_3Z$ wherein Z is a monovalent cation such as $Na^+$, or in which R is $-XR^1$ wherein the unit $-X-$ represents a single bond, $-O-$, $-S-$, $-CO-$, $-COO-$, $-OCO-$, $-SO-$, $-SO_2-$, $-N(R^2)-$ or $-N(R^2)CO-$, and wherein $R^1$ and $R^2$ are the same or different and constitute a straight-chain branched or cyclic $C_1$-$C_{20}$ alkyl group or together an $C_1$-$C_{20}$ alkylene group, in which $C_1$-$C_{20}$ alkyl or $C_1$-$C_{20}$ alkylene group one or more hydrogens are optionally substituted by F or a $C_4$-$C_{12}$ aryl group and/or one or more non-adjacent $-CH_2-$ units are optionally substituted by $C_4$-$C_{12}$ arylene, $-O-$, $-S-$, $-CO-$, $-COO-$, $-OCO-$, $-SO-$, $-SO_2-$, $-N(R^3)-$ or $-N(R^3)CO-$ where $R^3$ is $C_1$-$C_{20}$ alkyl, or in which R is a $C_4$-$C_{12}$ aryl group which may or may not be substituted, polymers having viscosities at least equal to the viscosity of said aryl-substituted poly-p-arylenevinylenes and organic electroluminescent devices comprising such polymers.

10 Claims, 1 Drawing Sheet

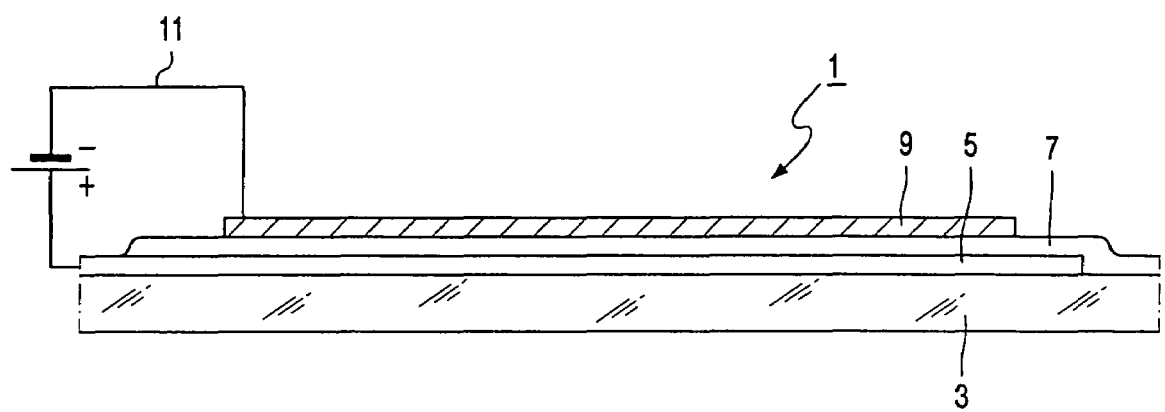

ARYL-SUBSTITUTED POLY-P-ARYLENEVINYLENES

This is a Continuation of application Ser. No. 09/790,201, filed Feb. 22, 2001 now U.S. Pat. No. 6,743,525.

The invention relates to aryl-substituted poly-p-arylenevinylenes, the use thereof in organic electroluminescent devices and organic electroluminescent devices comprising such aryl-substituted poly-p-arylenevinylenes.

Aryl-substituted poly-p-arylenevinylenes of the type mentioned in the opening paragraph and electroluminescent (EL) devices, polymer electroluminescent devices for short, comprising such polymers are disclosed in the international patent application WO 99/21936. Dependent on the particular structure, the polymers disclosed therein are capable of light emission in the green to red range of the visible spectrum. The color of light emission does not shift when a polymer EL device comprising the known polymer is stored at elevated ambient temperatures for an extended period of time. Furthermore, the polymer EL devices comprising these polymers have a service life exceeding 1500 to 5000 h when driven at a brightness of 20 Cd/m². For many purposes however, a brightness of 20 Cd/m² is too low and a brightness of at least 100 to 200 Cd/m² is required. This is for example the case in a matrix display device which is driven in a time-multiplexed manner. Although the brightness of an EL device can be simply increased by increasing the voltage at which it is driven increasing the brightness generally leads, as is well-known in the art, to a substantial reduction in service life. A further substantial reduction in service life is generally observed when a polymer EL device is driven at elevated ambient temperatures such as 70 to 80° C. However, satisfactory operation of the devices at those elevated temperatures for an extended period of time is a prerequisite for many applications. Such applications include display devices for automotive applications and mobile phones.

It is an object of the invention to provide, inter alia, aryl-substituted poly-p-arylenevinylenes which, when used in an organic EL device, render the EL device capable of providing a satisfactory service life when driven at an initial brightness of at least 100 or better still, at least 200 Cd/m². More in particular the EL device should be capable of providing a satisfactory service life even in the case where the EL device is driven at elevated ambient temperatures of 70 to 80° C.

In accordance with the invention, this objective is achieved by aryl-substituted poly-p-arylenevinylenes comprising a repeating unit of the formula (C1),

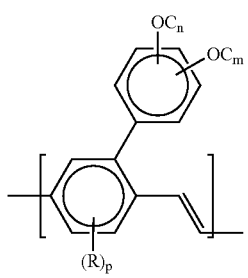

(C1)

in which one or more of the unsubstituted aromatic carbon atoms may be replaced by nitrogen atoms, —$OC_m$— and —$OC_n$— are alkoxy groups, m and n are integers from 2 to 6 with m+n=8, p is 0, 1, 2 or 3 and in which R is CN, Cl, F, $CF_3$, $NO_2$, or $SO_3Z$ wherein Z is a monovalent cation such as $Na^+$, or in which R is —$XR^1$ wherein the unit —X— represents a single bond, —O—, —S—, —CO—, —COO—, —OCO—, —SO—, —$SO_2$—, —$N(R^2)$— or —$N(R^2)CO$—, and wherein $R^1$ and $R^2$ are the same or different and constitute a straight-chain branched or cyclic $C_1$-$C_{20}$ alkyl group or together an $C_1$-$C_{20}$ alkylene group, in which $C_1$-$C_{20}$ alkyl or $C_1$-$C_{20}$ alkylene group one or more hydrogens are optionally substituted by F or a $C_4$-$C_{12}$ aryl group and/or one or more non-adjacent —$CH_2$— units are optionally substituted by $C_4$-$C_{12}$ arylene, —O—, —S—, —CO—, —COO—, —OCO—, —SO—, —$SO_2$—, —$N(R^3)$— or —$N(R^3)CO$— where $R^3$ is $C_1$-$C_{20}$ alkyl, or in which R is a $C_4$-$C_{12}$ aryl group which may or may not be substituted.

As a typical example, an organic EL device comprising a yellow to green light emitting polymer in accordance with the invention as electroluminescent material is capable of providing a service life of at least 45 to 200 h when subjected to an accelerated service life test which involves driving the device at a constant current, at an initial brightness of 200 Cd/m² and at an ambient temperature of 80° C.

An EL device comprising a red to orange light emitting polymer in accordance with the invention as electroluminescent material in an organic EL device is at least capable of providing a service life of at least 800 to 1200 h when subjected to an accelerated service life test which involves driving the device at a constant current, at an initial brightness of 100 Cd/m² and at an ambient temperature of 70° C.

In the context of the invention, the service life is defined as the time at which the brightness is reduced to half its initial value while driving the device at a constant current. Evidently, such a device is also capable of operating that long at a constant brightness of at least half said initial brightness.

In the context of the invention, the term organic includes polymeric whereas the term polymer and affixes derived therefrom, includes homopolymer, copolymer, terpolymer and higher homologues as well as oligomer.

In WO 98/271376, EL polymers similar to the polymers of WO 99/21936 are disclosed.

Preferably, the polymers in accordance with the invention are used as electroluminescent polymers. Alternatively, they may be suitably used as photoluminescent, charge-injecting and/or charge-transporting polymers. In case of an EL device comprising a single organic layer comprising the polymer in accordance with the invention, the polymer serves as charge-injecting charge-transport and electroluminescent polymer at the same time.

Referring to formula (C1), p is preferably 0 or 1 and R, if present, is located at a 5-position of the phenylene ring.

If the polymer is to emit green or more greenish light p is preferably 0 and R, if present, selected to be a $C_1$-$C_{20}$ alkyl group of the type defined above.

If the polymer is to emit yellow or more yellowish light the R is preferably selected to be a $C_1$-$C_{20}$ alkoxy group of the type defined above. Preferred alkoxy groups are $OC_4$, in particular 2-methylpropyloxy, and $OC_8$, in particular 3,7-dimethylhexyloxy. Even more preferred is methoxy.

In another preferred embodiment, the polymer is characterized in that the proportion of repeating units which are repeating units of formula (C1) is at least 0.95. The benefit in terms of service life to be had by using the polymers in accordance with the invention is optimized if the proportion of repeating units of formula (C1) is as large as possible. Preferred is a proportion of at least 0.95 because then the emission spectrum of the copolymer or higher homologue substantially coincides with that of the homopolymer of repeating units according to formula (C1).

In yet another preferred embodiment, the polymer is characterized in that the proportion of repeating units which are repeating units of formula C1 is less than 0.95. In order to widen the range of properties available within the class of polymers in accordance with the invention, which may for example be advantageous if the emission spectrum of the polymer is to be adapted to suit the needs for a particular application, a plurality of different repeating units is preferably used thus obtaining copolymers, terpolymers and higher homologues. In order to substantially retain the service life enhancing property of the polymers comprising the repeating unit of the formula (C1), the proportion should be preferably at least 0.35.

In a particular embodiment, the polymer in accordance with the invention has, apart from the repeating unit of formula (C1) at least one further type of 1,4-phenylenevinylene repeating unit. Use of copolymers, terpolymers etc. of 1,4-phenylenevinylene repeating units in EL devices is attractive since they combine a high luminescence efficiency with good electron- and hole-transporting and injecting properties. Moreover they can be processed in a simple manner from solution.

If the polymer comprises a plurality of repeating units thus obtaining copolymers, terpolymers and the like it is most preferred that each of said units is a repeating unit of the formula (C1) or preferred embodiments thereof.

In accordance with WO 99/21936, in order to reduce red shift the further 1,4-phenylenevinylene repeat unit comprises a 2-aryl-1,4-phenylene unit wherein aryl is a phenyl, naphthyl, or biphenylyl group which may or may not be substituted and/or in which, optionally, one or more of the non-substituted aromatic carbon atoms are replaced by nitrogen atoms. Preferred in this respect are polymers wherein the further repeating unit comprises a 2-phenyl-1,4-phenylene or 2,5-diphenyl-1,4-phenylene unit wherein each phenyl group is optionally substituted by one or more substituents R, wherein R has the same meaning as in formula (C1) and each occurrence of R involves a selection independent of the other occurrences.

With respect to suitable methods of preparing the polymers in accordance with the invention and monomers used to prepare said polymers reference is made to methods disclosed in the international applications WO 98/27136 and WO 99/21936 which are hereby incorporated by reference.

The invention further relates to the use of a polymer in accordance with the invention in an organic electroluminescent device.

In a preferred embodiment of said use, the device is operated at a brightness of at least 100 $Cd/m^2$ or even at least 200 $Cd/m^2$.

In a more preferred embodiment of said use, the device is operated at a brightness of at least 100 $Cd/m^2$ or even at least 200 $Cd/m^2$ for at least 45 h or better at least 200 h. This in particular applies to the use of a yellow to green light emitting polymer. In another preferred use, the polymer is a red to orange light emitting polymer used in a EL device operated for at least 800 to 1200 h at a brightness of at least 100 $Cd/m^2$.

A particular embodiment relates to the use wherein the organic electroluminescent device is operated such that the temperature of the device is at least 5 to 10° C. above room temperature.

It has been found that if the brightness of organic EL device having a large light emitting surface area, say at least 10 to 20 $cm^2$, such as a back light for an LCD, and comprising a polymer of the type disclosed in WO 99/21936 is increased from 20 to 100-200 $Cd/m^2$, the temperature of the device increases by 5 to 10° C. This is due to the heat generated by the device itself. Further experiments have shown that this seemingly small increase in temperature leads to a reduction in service life by a factor of as much as two. Since the polymers in accordance with the invention already have an excellent service life when driven at ambient temperatures of 70 to 80° C., the polymers in accordance with the invention can be suitably used in an EL device which is operated such that the device temperature is at least 5 to 10° C. above room temperature.

In a further aspect, the invention relates to an organic electroluminescent device comprising an aryl-substituted poly-p-arylenevinylene in accordance with the invention.

Preferably, the aryl-substituted poly-p-arylenevinylene in accordance with the invention is used as the electroluminescent material.

Apart from comprising the polymers in accordance with the invention, the EL device may be of a conventional type.

Generally, a conventional organic or, in particular polymer, EL device comprises at least an organic or, in particular polymer, electroluminescent layer disposed between an electron-injecting electrode (a cathode) and a hole-injecting electrode (an anode). If a suitable voltage is applied to the electrodes, the organic EL layer emits light. Using different organic EL materials the color of the light emitted can be varied.

Preferably, the polymer in accordance with the invention is part of the material from which the organic electroluminescent layer is made but it may also be part of other layers such as transport or injecting layers. Optionally, the organic EL material contains further substances, organic or inorganic in nature, which may be homogeneously distributed on a molecular scale or present in particulate form. In particular, compounds improving the charge-injecting and/or charge-transport capability of electrons and/or holes, compounds to improve and/or modify the intensity or color of the light emitted, stabilizers, and the like may be present.

The organic EL layer preferably has an average thickness of 50 nm to 200 nm, in particular, 60 nm to 150 nm or, preferably, 70 nm to 100 nm.

The electron-injecting electrode is suitably made of a metal (alloy) having a low work function, such as Yb, Ca, Mg:Ag Li:Al, Ba or is a laminate of different layers such as Ba/Al or Ba/Ag electrode in which preferably the Ba layer is less than 10 nm thick.

The hole-injecting electrode is suitably made of a metal (alloy) having a high work function such as Au, Pt, Ag. Preferably, a more transparent hole-injecting electrode material, such as an indiumtinoxide (ITO), is used. Conductive polymers such as a polyaniline (PANI) and a poly-3,4-ethyl-enedioxythiophene (PEDOT) are also suitable transparent hole-injecting electrode materials. Preferably, a PANI layer has a thickness of 50 to 200 nm, and a PEDOT layer 100 to 300 nm.

Generally the EL device is supported by a substrate. Suitable substrate materials include quartz, ceramics, glass and synthetic resins which may or may not be flexible. Preferably, the substrate is transparent with respect to the light to be emitted. If a transparent hole-injecting electrode such as ITO is used the EL device is preferably supported by the substrate via this ITO hole-injecting electrode.

Optionally, the EL device comprises additional layers disposed between the electrodes. Such additional layers include hole-injecting and/or transport (HTL) layers and electron-injecting and/or transport (ETL) layers. In order to improve service life, luminous efficiency (e.g. expressed in Cd/A) and/or power efficiency (e.g. expressed in lm/W) EL devices which comprise a laminate of anode/HTL layer/EL layer/cathode, anode/EL layer/ETL layer/cathode, or anode/HTL layer/EL layer/ETL layer/cathode are preferred.

In addition to the polymers in accordance with the invention, suitable materials for the hole-injecting and/or hole-transport layers (HTL) include aromatic tertiary amines, in particular diamines or higher homologues, polyvinylcarbazole, quinacridone, porphyrins, phthalocyanines, polyaniline and poly-3,4-ethylenedioxythiophene.

In addition to the polymers in accordance with the invention, suitable materials for the electron-injecting and/or electron-transport layers (ETL) are oxadiazole-based compounds and aluminiumquinoline compounds.

If ITO is used as the anode, the EL device preferably comprises a 50 to 300 nm thick layer of the hole-injecting/-transport layer material poly-3,4-ethylenedioxythiophene or a 50 to 200 nm thick layer of polyaniline.

The EL device in accordance with the invention can be suitably used as a lighting or display device. Particularly, the EL device can be used as a back light for a liquid crystal display, as a segmented display device or a matrix display device of the passive or active type or a display in which several of these types of displays are combined. Both full-color and monochrome display devices can be made.

A particular embodiment of the EL device in accordance with the invention is capable of providing a service life of at least 45 to 200 h when driven at a constant current, at an initial brightness of 200 Cd/m$^2$, and at an ambient temperature of 80° C. In order to enable to EL device to provide said capability it not only comprises a polymer in accordance with the invention as the EL material but is further specifically adapted by including a voltage source such as a battery capable of providing a voltage necessary to operate the device at a brightness of at least 200 Cd/m$^2$.

Another particular embodiment of the EL device in accordance with the invention comprises a red to orange light emitting aryl-substituted poly-p-arylenevinylene and is capable of providing a service life of at least 800 to 1200 h when driven at a constant current, at an initial brightness of 100 Cd/m$^2$, and at an ambient temperature of 70° C. In order to enable the EL device to provide said capability it not only comprises a polymer in accordance with the invention as the EL material but is further specifically adapted by including a voltage source capable of providing a voltage necessary to operate the device at a brightness of at least 100 Cd/m$^2$.

In another related aspect, the invention relates to an organic electroluminescent device comprising an organic electroluminescent, charge-transport and/or charge-injecting layer consisting of a material which, at least at one temperature in the range of 100 to 200° C., has a viscosity higher than or equal to the viscosity of an aryl-substituted poly-p-arylenevinylene in accordance with the invention.

Surprisingly, it is found that the service life of an organic EL device depends on the viscosity of the material from which the organic layer is made. In particular, a high viscosity is found to increase the service life of the organic EL devices. Even more surprisingly it is found that this applies for organic EL devices driven at temperatures much lower than the 100 to 200° C. temperature range at which the viscosity is measured. Although in principle there is no reason to suppose that this dependency does not apply to all organic electroluminescent charge-transporting and/or charge-injecting materials used in organic EL devices it applies in particular if the material comprises a poly-p-arylenevinylene. More in particular it applies to the polymers in accordance with the invention.

Since the temperatures experienced by EL devices are in practice generally lower than 100° C., preferably, the viscosity near the lower end of the temperature range of 100 to 200° C. is higher than the viscosity of the aryl-substituted poly-p-arylenevinylenes in accordance with the invention.

Preferred embodiments of the EL device in accordance with the invention are An organic electroluminescent device comprising an organic electroluminescent, charge-transport and/or charge-injecting layer consisting of a material which, at least at one temperature in the range of 100 to 200° C., has a viscosity higher than or equal to the viscosity of an aryl-substituted poly-p-arylenevinylene in which the Aryl-substituted poly-p-arylenevinylenes comprising a repeating unit of the formula (C1),

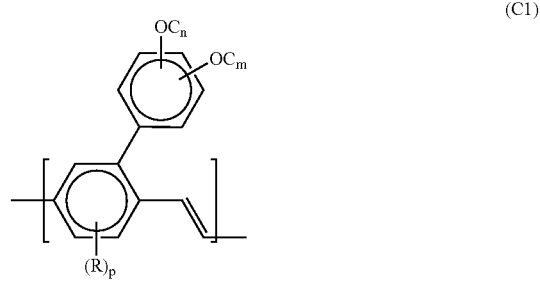

(C1)

in which one or more of the unsubstituted aromatic carbon atoms may be replaced by nitrogen atoms, —OC$_m$ and —OC$_n$ are alkoxy groups, m and n are integers from 2 to 6 with m+n=8, p is 0, 1, 2 or 3 and in which R is CN, Cl, F, CF$_3$, NO$_2$, or SO$_3$Z wherein Z is a monovalent cation such as Na$^+$, or in which R is —XR$^1$ wherein the unit —X— represents a single bond, —O—, —S—, —CO—, —COO—, —OCO—, —SO—, —SO$_2$—, —N(R$^2$)— or —N(R$^2$)CO—, and wherein R$^1$ and R$^2$ are the same or different and constitute a straight-chain branched or cyclic C$_1$-C$_{20}$ alkyl group or together an C$_1$-C$_{20}$ alkylene group, in which C$_1$-C$_{20}$ alkyl or C$_1$-C$_{20}$ alkylene group one or more hydrogens are optionally substituted by F or a C$_4$-C$_{12}$ aryl group and/or one or more non-adjacent —CH$_2$— units are optionally substituted by C$_4$-C$_{12}$ arylene, —O—, —S—, —CO—, —COO—, —OCO—, —SO—, —SO$_2$—, —N(R$^3$)— or —N(R$^3$)CO— where R$^3$ is C$_1$-C$_{20}$ alkyl, or in which R is a C$_4$-C$_{12}$ aryl group which may or may not be substituted;

Or such Aryl-substituted poly-p-arylenevinylenes wherein —OC$_m$ and/or —OC$_n$ is 2-methylpropyloxy;

Or Aryl-substituted poly-p-arylenevinylenes wherein the repeating unit (C1) is a 2-(3',4'-bis(2-methylpropyloxy)phenyl)-1,4-phenylene-vinylene repeating unit.

Another preferred embodiment is an organic electroluminescent device comprising an organic electroluminescent, charge-transport and/or charge-injecting layer consisting of a material which, at least at one temperature in the range of 100 to 200° C., has a viscosity higher than or equal to the viscosity of an aryl-substituted poly-p-arylenevinylene in which the Aryl-substituted poly-p-arylenevinylenes comprising a repeating unit of the formula (C2)

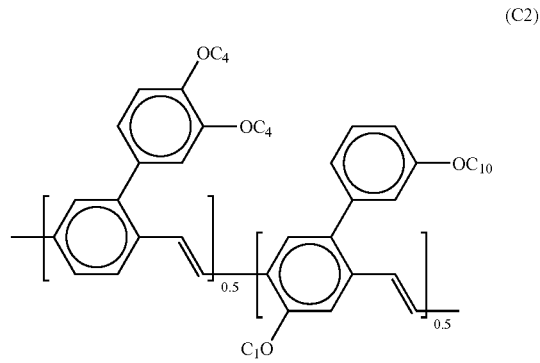

(C2)

where —OC$_{10}$ is 3,7-dimethyloctyloxy and —OC$_4$ is 2-methylpropyloxy.

Yet another preferred embodiment of the invention is an organic electroluminescent device as characterized in that the material from which the electroluminescent, the charge-transport and/or the charge-injecting layer is made has, at least at one temperature in the range of 100 to 200° C., a viscosity which is higher than or equal to the viscosity of the polymer of the repeating unit according to the formula (C3)

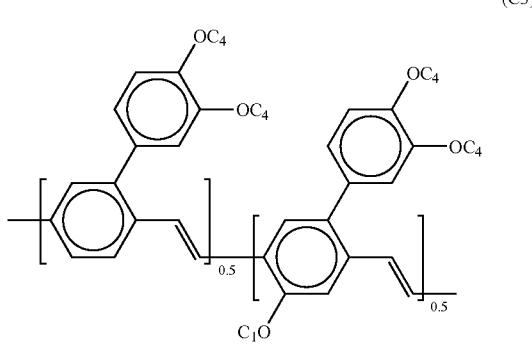

(C3)

where —OC₄ is 2-methylpropyloxy.—

Many methods of measuring the viscosity are known in the art and may be used to measure the viscosity of the material.

In the context of the invention it is preferred to use a method which measures a viscosity-related parameter. Hereinafter this viscosity-related parameter is referred to as the viscosity η. This preferred method comprises the steps of:

a) providing, on a substrate, a film of the material of thickness $h_0$ and providing a steel ball having a radius R;

b) bringing both the film and the ball to a temperature T within a range of 100 to 200° C.;

c) positioning the ball on a surface of the film facing away from the substrate and pressing the ball into the film in a direction at right angles to the substrate with a force F during a time t, thus producing a circular indentation, if any, in the film;

d) removing the steel ball and measuring the radius of indentation r of the circular indentation;

e) determining the viscosity η from the equation (A1)

$$\frac{Ft}{6\pi\eta R^2} = \frac{3}{2} + \frac{1}{2(h/h_0)^2} - \frac{2}{(h/h_0)} - \log(h/h_0) \quad \text{(A1)}$$

wherein h is determined from the equation (A2), $$r=\sqrt{4Rh_0(1-(h/h_0))} \quad \text{(A2), and}$$

$h_0$ is the initial film thickness, f) optionally, repeating steps a)-e) using a different temperature T.

The ball is to be removed slowly so as to avoid viscous fingering. The magnitude of the viscosity is in general such that the material flows back very slowly allowing enough time for an accurate measurement of the radius of indentation.

An important advantage of this method is that material of which the viscosity is to be determined can be provided in the form of a layer. The method can even be used for very thin layers (<1 µm) which also demonstrates that only a very small amount of material is necessary to obtain a measurement. The value of the viscosity is accurate within a factor of The method being suitable to determine the viscosity of thin layers and the EL device in accordance with the invention comprising such a thin layer of organic material, the EL device itself can be used as the sample for determining the viscosity which makes the method convenient for example quality control purposes. In order to render the EL device suitable for measuring the viscosity, layers covering the organic layer or layers such as the cathode layer may have to be removed.

These and other aspects of the invention will be apparent from and elucidated with reference to the examples described hereinafter.

In the drawings:

The sole FIGURE schematically shows, in a cross-sectional view, an organic EL device.

COMPARATIVE EXAMPLE 1

(Red to Orange Light Emission)

Referring to FIG. 1, in this comparative example, an electroluminescent device 1 comprises a substrate 3 of sodalime glass coated with a layer of an indiumtinoxide (ITO) supplied by Balzers which is in turn covered by a 250 nm layer of the hole-injecting material poly-3,4-ethylenedioxythiophene (supplier Bayer) provided by means of spin-coating. The latter two layers together constitute the hole-injecting electrode 5. The electroluminescent layer 7 is also provided by means of spin-coating and is made of a material consisting of an aryl-substituted poly-p-arylenevinylene of the repeating unit of formula (C4)

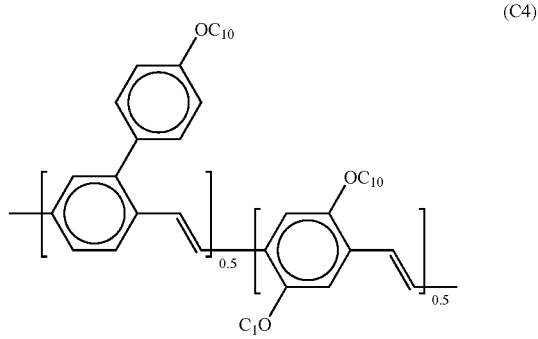

(C4)

wherein $OC_{10}$ is 3,7-dimethyloctyloxy and which is a polymer not in accordance with the invention. The polymer C4 is disclosed in WO 99/21936 and photo- and electroluminesces red to orange light. The EL layer 7 is covered, in succession, with a Ba and Al layer which together form the electron-injecting electrode 9 each layer being applied by means of deposition of metal vapor in vacuo. The EL device 1 further includes a voltage source 11 capable of providing a voltage sufficient to obtain an emission of light of brightness 100 Cd/m2 or more. The EL device 1 is encapsulated so as to avoid contact with oxygen and water.

The EL device 1 is subjected to a service life test in which the device, the positive pole of the voltage source being connected to the anode 5 and the negative electrode to the cathode 9, is driven at constant current and at an initial brightness of 100 Cd/m² while maintaining an ambient temperature of 70° C. The service life, defined as the time within which the brightness drops to half its initial value, thus determined is about 180 h. The voltage increase needed to maintain a constant current during the service life is about 0.015 V/h. By comparison, according to WO 99/21936, the service life at 20 Cd/m² and room temperature exceeds 5000 h which demonstrates the drastic reduction of service life associated with the use of a higher brightness and an elevated ambient temperature of 70° C.

EXAMPLE 1

(Red to Orange Light Emission)

The previous example is repeated with the difference that the EL layer 9 is made of an aryl-substituted poly-p-arylenevinylene polymer in accordance with the invention, said polymer being a polymer of the repeating unit of the formula (C5) or (C6)

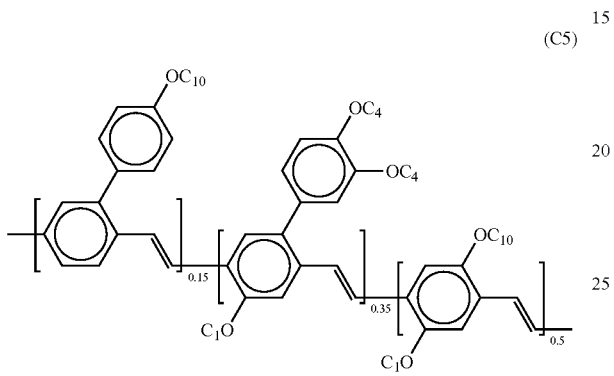

(C5)

The polymers of formula (C5) and (C6) are synthesized according to processes analogous to processes disclosed in WO 98/27136 and/or WO 99/21936 which are hereby incorporated by reference. The monomers (intermediate compounds) corresponding to the different repeating units are disclosed in said international applications.

The EL devices based on the polymers of formula (C5) and (C6) emit red to orange light.

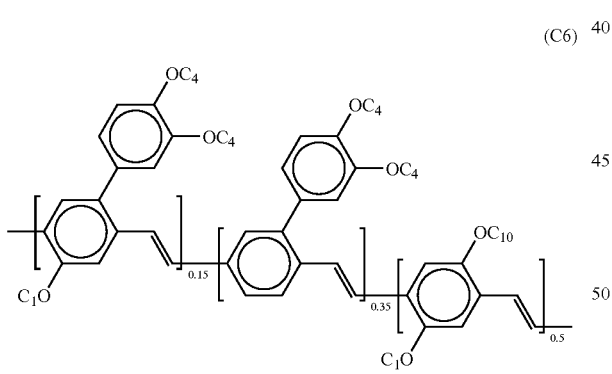

(C6)

When subjected to the service life test of the comparative example, the service life of the EL device comprising the polymer of formula (C5) is 925 h. The voltage increase is about 2 mV/h. By collecting the data for a large number of samples the service life is found to be at least 800 to 1200 h.

Similarly, the service life of the EL device comprising the polymer of formula (C6) is also at least 800 to 1200 h. The voltage increase is about 1.5 to 2 mV/h.

This example clearly demonstrates that the service life increases significantly by using an aryl-substituted poly-p-arylenevinylene in accordance with the invention. In particular, it demonstrates the use of a red to orange light emitting polymer in accordance with the invention in an organic EL device capable of providing a service life of at least 800 to 1200 h when driven at a constant current, an initial brightness of 100 Cd/m², and an ambient temperature of 70° C.

COMPARATIVE EXAMPLE 2

(Yellow to Green Light Emissive Polymers)

Comparative example 1 is repeated with the difference that the polymer is replaced by a polymer not in accordance with the invention and emitting yellow to green light, this polymer being a polymer of repeating unit of formula (C7)

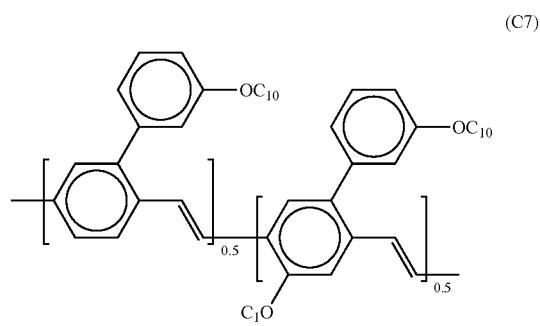

(C7)

wherein $OC_{10}$ is 3,7-dimethyloctyloxy.

The device thus obtained is subjected to a service life test similar to that of comparative example 1, in which the EL device is driven at constant current and at an initial brightness of 200 Cd/m² while maintaining an ambient temperature of 80° C. The service life, defined as the time within which the brightness drops to half its initial value, thus determined is about 10 h. The efficiency of the EL device is 9.0 Cd/A.

EXAMPLE 2

(Yellow to Green Light Emissive Polymers)

Comparative example 2 is repeated with the difference that the polymer is replaced by a polymer in accordance with the invention emitting yellow to green light, this polymer being a polymer of repeating unit of formula (C2)

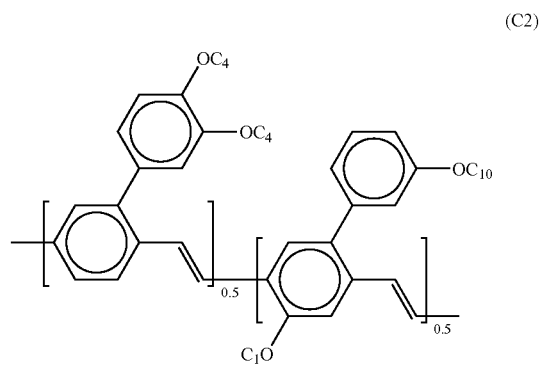

(C2)

wherein $OC_{10}$ is 3,7-dimethyloctyloxy and $OC_4$ is 2-methylpropyloxy. When the EL device thus obtained is subjected to the service life test of comparative example 2, in which the EL device is driven at constant current and at an initial brightness of 200 Cd/m² while maintaining an ambient temperature of 80° C., the service life, defined as the time within which the brightness drops to half its initial value, is about 55 h, whereas the efficiency of the EL device is 9.0 Cd/A.

Similarly, the EL device comprising the yellow light-emitting polymer of repeating unit according to formula (C8)

(C8)

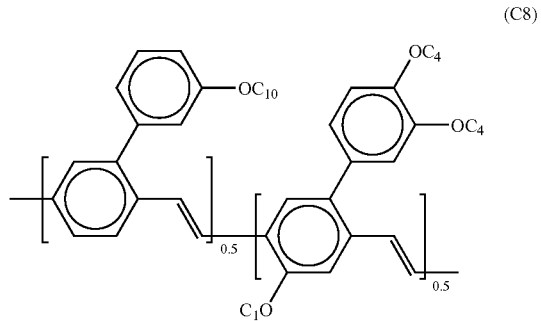

as the EL material has a service life of 70 h and an efficiency of 9.0 Cd/A.

The EL device comprising the yellow light-emitting polymer of repeating unit of formula (C3) as the EL material has, when subjected to the same accelerated service life test, a service life of 200 h and an efficiency of 9.0 Cd/A.

(C3)

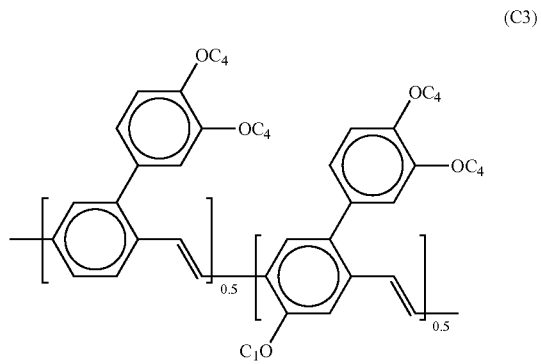

EXAMPLE 3

The viscosity of the polymer with repeating unit according to the formula (C7) is measured as follows:

An ITO-coated glass substrate is provided with a layer of the polymer by means of spin-coating. The thickness $h_0$ of the layer is 266 nm.

The substrate thus obtained is mounted on a base plate provided with a heating foil and a thermocouple allowing the temperature of the substrate to be controlled. The temperature of the polymer layer is monitored using a thermocouple glued thereon.

A steel ball having a radius R of 1.50 mm is polished to optical quality and fitted with a heating element in the form of NTC resistor and thermocouple.

The steel ball and the substrate are then each brought to a temperature T of 100° C. and stabilized at that temperature for about 10 min.

With the substrate resting on the base plate, the steel ball is carefully positioned on the surface of the polymer layer facing away from the substrate so as to avoid strong impact.

For a loading time t of typically 60 to 600 s the ball is left positioned on the substrate. The ball exerts a gravitational force on the layer which, due to the viscous nature of the layer, makes it sink slowly into the layer thus producing a circular indentation. The force F which is exerted by the ball on the film is 0.63 N.

After the loading time t has elapsed the steel ball is removed slowly so as to avoid viscous fingering.

A new measurement is made by positioning the ball about a quarter mm away from the indentation. This process is repeated a number of times at different temperatures in the range of 100 to 200° C.

Of each of the circular indentations thus produced the radius of indentation r is measured using a microscope provided with an interference contrast facility, and the viscosity $\eta$ is determined from the equation (A1)

$$\frac{Ft}{6\pi\eta R^2} = \frac{3}{2} + \frac{1}{2(h/h_0)^2} - \frac{2}{(h/h_0)} - \log(h/h_0) \quad (A1)$$

wherein h is determined from the equation (A2), $$r = \sqrt{4Rh_0(1-(h/h_0))} \quad (A2),\text{ and}$$

$h_0$ is the initial layer thickness.

The magnitude of the viscosity is in general such that the material flows back very slowly allowing enough time for an accurate measurement of the radius of indentation after all the indentations have been made.

At large loading times t and temperatures T it may happen that the ball sinks all the way through the film. In this case the film thickness $h_0$ can be determined. The thickness thus obtained corresponds well to the thickness determined using atomic force microscopy (AFM).

Using the method described above which involves a film of 266 nm thickness, it is found that the relationship between log $\eta$ and 1/T of the polymer with repeating unit according to formula (C7) is approximately linear. The viscosity at 100° C. is $1.10^7$ Pa·s and at 160° C. about $1.10^5$ Pa·s. At temperatures below 100° C. the ball does not produce a measurable indentation.

The measurements are repeated using a 327 nm thick layer of the polymer with repeating unit according to the formula (C2). Again, an approximately linear relationship between log $\eta$ and 1/T is observed. At 100° C. the viscosity is $5.10^7$ Pa·s whereas at 160° C. it is about $5.10^5$ Pa·s.

The measurements are repeated using the polymer with repeating unit according to the formula (C3). The viscosity of this polymer is so high that at no temperature below 200° C. the steel ball produces a measurable indentation.

The combined results of this example and example 2 demonstrate that, in accordance with the invention, in order to improve the service life of an EL device comprising an organic layer, or in particular a polymer electroluminescent layer, the viscosity of the polymer must be high.

What is claimed is:

1. Aryl-substituted poly-p-arylenevinylene consisting of a repeating unit of the formula (C1), (C1)

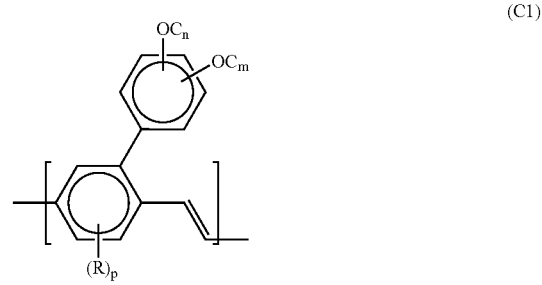

in which —OC$_m$ and —OC$_n$ are alkoxy groups, m and n are integers from 2 to 6 with m+n=8, p is 1, 2 or 3 and in which R is CN, Cl, F, CF$_3$, NO$_2$ or SO$_3$Z wherein Z is a monovalent cation, or in which R is —XR$^1$ wherein the unit —X— represents a single bond, —O—, —S—, —CO—, —COO—, —OCO—, —SO—, —SO$_2$—, —N(R$^2$)— or —N(R$^2$)CO—;

wherein R$^1$ and R$^2$ are the same or different and constitute a straight-chain branched or cyclic C$_1$-C$_{20}$ alkyl group or together a C$_1$-C$_{20}$ alkylene group, in which C$_1$-C$_{20}$ alkyl group or C$_1$-C$_{20}$ alkylene group one or more hydrogens are optionally substituted by F or a C$_4$-C$_{12}$ aryl group and/or one or more non-adjacent —CH$_2$— units are optionally substituted by C$_4$-C$_{12}$ arylene, —O—, —S—, —CO—, —COO—, —OCO—, —SO—, —SO$_2$—, —N(R$^3$)— or —N(R$^3$)CO—, and where R$^3$ is C$_1$-C$_{20}$ alkyl, or in which R is a C$_4$-C$_{12}$ aryl group which may or may not be substituted, said aryl-substituted poly-p-arylenevinylene when incorporated in an active layer of an organic electroluminescent device having one or more active layers being effective to enhance the service life of said organic electroluminescent device to at least 45 h when said electroluminescent device is driven at a constant current, at an initial brightness of 200 Cd/m$^2$, and at an ambient temperature of 80° C.

2. Aryl-substituted poly-p-arylenevinylene as claimed in claim 1 wherein m=n.

3. Aryl-substituted poly-p-arylenevinylene as claimed in claim 1 wherein —OC$_m$ and/or —OC$_n$ is 2-methylpropyloxy.

4. Aryl-substituted poly-p-arylenevinylene as claimed in claim 3 wherein the repeating unit (C1) is a 2-(3',4'-bis(2-methylpropyloxy)phenyl)-1,4-phenylene vinylene repeating unit.

5. An organic electroluminescent device comprising:
an aryl-substituted poly-p-arylenevinylene consisting of a repeating unit of the formula (C1),

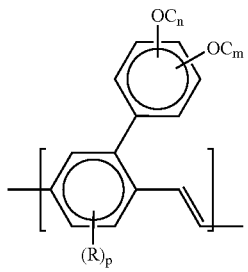

(C1)

in which —OC$_m$ and —OC$_n$ are alkoxy groups, m and n are integers from 2 to 6 with m+n=8, p is 1, 2 or 3 and in which R is CN, Cl, F, CF$_3$, NO$_2$ or SO$_3$Z wherein Z is a monovalent cation, or in which R is —XR$^1$ wherein the unit —X— represents a single bond, —O—, —S—, —CO—, —COO—, —OCO—, —SO—, —SO$_2$—, —N(R$^2$)— or —N(R$^2$)CO—, and wherein R$^1$ and R$^2$ are the same or different and constitute a straight-chain branched or cyclic C$_1$-C$_{20}$ alkyl group or together a C$_1$-C$_{20}$ alkylene group, in which C$_1$-C$_{20}$ alkyl group or C$_1$-C$_{20}$ alkylene group one or more hydrogens are optionally substituted by F or a C$_4$-C$_{12}$ aryl group and/or one or more non-adjacent —CH$_2$— units are optionally substituted by C$_4$-C$_{12}$ arylene, —O—, —S—, —CO—, —COO—, —OCO—, —SO—, —SO$_2$—, —N(R$^3$)— or —N(R$^3$)CO—, and where R$^3$ is C$_1$-C$_{20}$ alkyl, or in which R is a C$_4$-C$_{12}$ aryl group which may or may not be substituted;

the service life of said organic electroluminescent device being enhanced to at least 45 h when said device is driven at a constant current, at an initial brightness of 200 Cd/m$^2$, and at an ambient temperature of 80° C.

6. An organic electroluminescent device according to claim 5, wherein m=n.

7. An organic electroluminescent device according to claim 5, wherein —OC$_m$ and/or —OC$_n$ is 2-methylpropyloxy.

8. An organic electroluminescent device according to claim 7, wherein the repeating unit (C1) is a 2-(3',4'-bis(2-methylpropyloxy)phenyl)-1,4-phenylene vinylene repeating unit.

9. An aryl-substituted poly-p-arylenevinylene selected from the group consisting of polymers having the formulae:

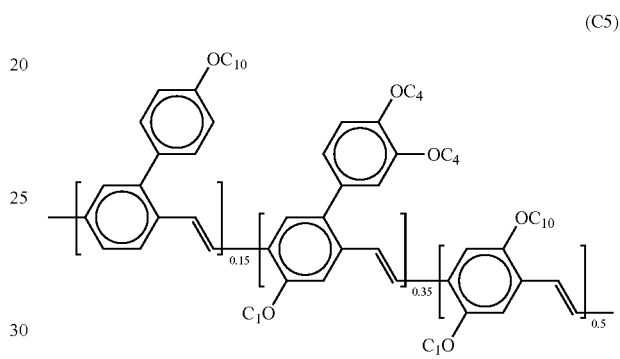

(C5)

and

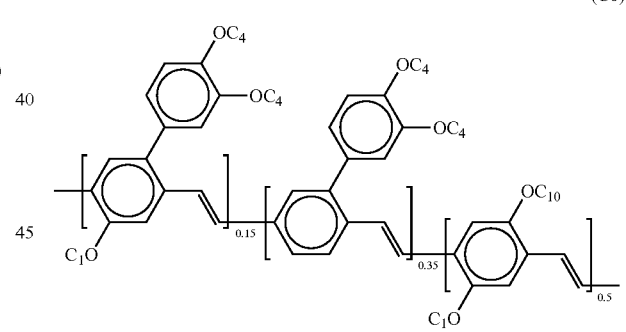

(C6)

wherein OC$_4$ is a 2-methylpropyloxy group and OC$_{10}$ is a 3,7-dimethyloctyloxy group, said aryl-substituted poly-p-arylenevinylene when incorporated in an active layer of an organic electroluminescent device having one or more active layers being effective to enhance the service life of said organic electroluminescent device to at least 800 h when electroluminescent device is driven at a constant current, at an initial brightness of 100 Cd/m$^2$, and at an ambient temperature of 70° C.

10. An organic electroluminescent device comprising an aryl-substituted poly-p-arylenevinylene as claimed in claim 9 capable of providing a service life of at least 800 h when driven at a constant current, at an initial brightness of 100 Cd/m$^2$, and at an ambient temperature of 70° C.

* * * * *